United States Patent

Smeys

(10) Patent No.: US 9,422,156 B2
(45) Date of Patent: Aug. 23, 2016

(54) INTEGRATED CMOS AND MEMS SENSOR FABRICATION METHOD AND STRUCTURE

(71) Applicant: InvenSense, Inc., San Jose, CA (US)

(72) Inventor: Peter Smeys, San Jose, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/752,718

(22) Filed: Jun. 26, 2015

(65) Prior Publication Data

US 2016/0002028 A1 Jan. 7, 2016

Related U.S. Application Data

(60) Provisional application No. 62/021,626, filed on Jul. 7, 2014.

(51) Int. Cl.
B81C 1/00 (2006.01)
B81B 7/00 (2006.01)
B81B 7/02 (2006.01)

(52) U.S. Cl.
CPC ............ *B81C 1/00238* (2013.01); *B81B 7/02* (2013.01); *B81C 1/00246* (2013.01); *B81C 2201/0197* (2013.01)

(58) Field of Classification Search
CPC .......... B81C 1/00238; B81C 1/00246; B81C 2201/019; B81B 7/02
USPC ...................................... 438/51; 257/415–418
See application file for complete search history.

(56) References Cited

U.S. PATENT DOCUMENTS

| 8,520,285 | B2* | 8/2013 | Fike, III | B32B 37/003 156/145 |
| 8,587,077 | B2* | 11/2013 | Chen | B81C 1/00238 257/254 |
| 2006/0121373 | A1* | 6/2006 | Yang | G03F 7/70525 430/22 |
| 2006/0148137 | A1* | 7/2006 | Hartzell | B81C 1/0023 438/149 |
| 2012/0074590 | A1* | 3/2012 | Lin | B81C 1/00269 257/777 |
| 2013/0168740 | A1 | 7/2013 | Chen | |
| 2013/0334620 | A1* | 12/2013 | Chu | B81C 1/00238 257/415 |
| 2014/0015069 | A1* | 1/2014 | Liang | B81B 7/02 257/415 |

OTHER PUBLICATIONS

Office Action for Taiwanese Patent Application No. 104121988 mailed on May 24, 2016, 12 pages.

* cited by examiner

Primary Examiner — Karen Kusumakar
(74) Attorney, Agent, or Firm — Amin, Turocy & Watson, LLP

(57) ABSTRACT

A method of providing a CMOS-MEMS structure is disclosed. The method comprises patterning a first top metal on a MEMS actuator substrate and a second top metal on a CMOS substrate. Each of the MEMS actuator substrate and the CMOS substrate include an oxide layer thereon. The method includes etching each of the oxide layers on the MEMS actuator substrate and the base substrate, utilizing a first bonding step to bond the first patterned top metal of the MEMS actuator substrate to the second patterned top metal of the base substrate. Finally the method includes etching an actuator layer into the MEMS actuator substrate and utilizing a second bonding step to bond the MEMS actuator substrate to a MEMS handle substrate.

20 Claims, 8 Drawing Sheets

INTEGRATED CMOS AND MEMS SENSOR FABRICATION METHOD AND STRUCTURE

CROSS-REFERENCE TO RELATED APPLICATION

This application claims benefit under 35 USC 119(e) of U.S. Provisional Patent Application No. 62/021,626, filed on Jul. 7, 2014, entitled "INTEGRATED CMOS AND MEMS SENSOR FABRICATION METHOD AND STRUCTURE," which is incorporated herein by reference in its entirety.

FIELD OF THE INVENTION

The present invention relates generally to CMOS-MEMS integrated devices and more particularly to method of fabrication for CMOS-MEMS integrated devices.

BACKGROUND

Traditionally to provide a CMOS-MEMS structure with at least one cavity therein a high bonding force (300 psi or greater) is required at a high temperature (above 400 degrees) to effectively bond the CMOS substrate to a MEMS substrate. The high temperature causes high stresses on the bonded structure. In addition, a timed etch to form a standoffs is required and therefore to control a gap height in the structure can be difficult to achieve. Accordingly, what is needed is a system and method to address the above identified issues. The present invention addresses such a need.

SUMMARY

A method of providing a CMOS-MEMS structure is disclosed. The method comprises patterning a first top metal on a MEMS actuator substrate and a second top metal on a CMOS substrate. Each of the MEMS actuator substrate and the CMOS substrate include an oxide layer thereon. The method includes etching each of the oxide layers on the MEMS actuator substrate and the base substrate, utilizing a first bonding step to bond the first patterned top metal of the MEMS actuator substrate to the second patterned top metal of the base substrate. Finally the method includes etching an actuator layer into the MEMS actuator substrate and utilizing a second bonding step to bond the MEMS actuator substrate to a MEMS handle substrate.

DETAILED DESCRIPTION

Figure 1:
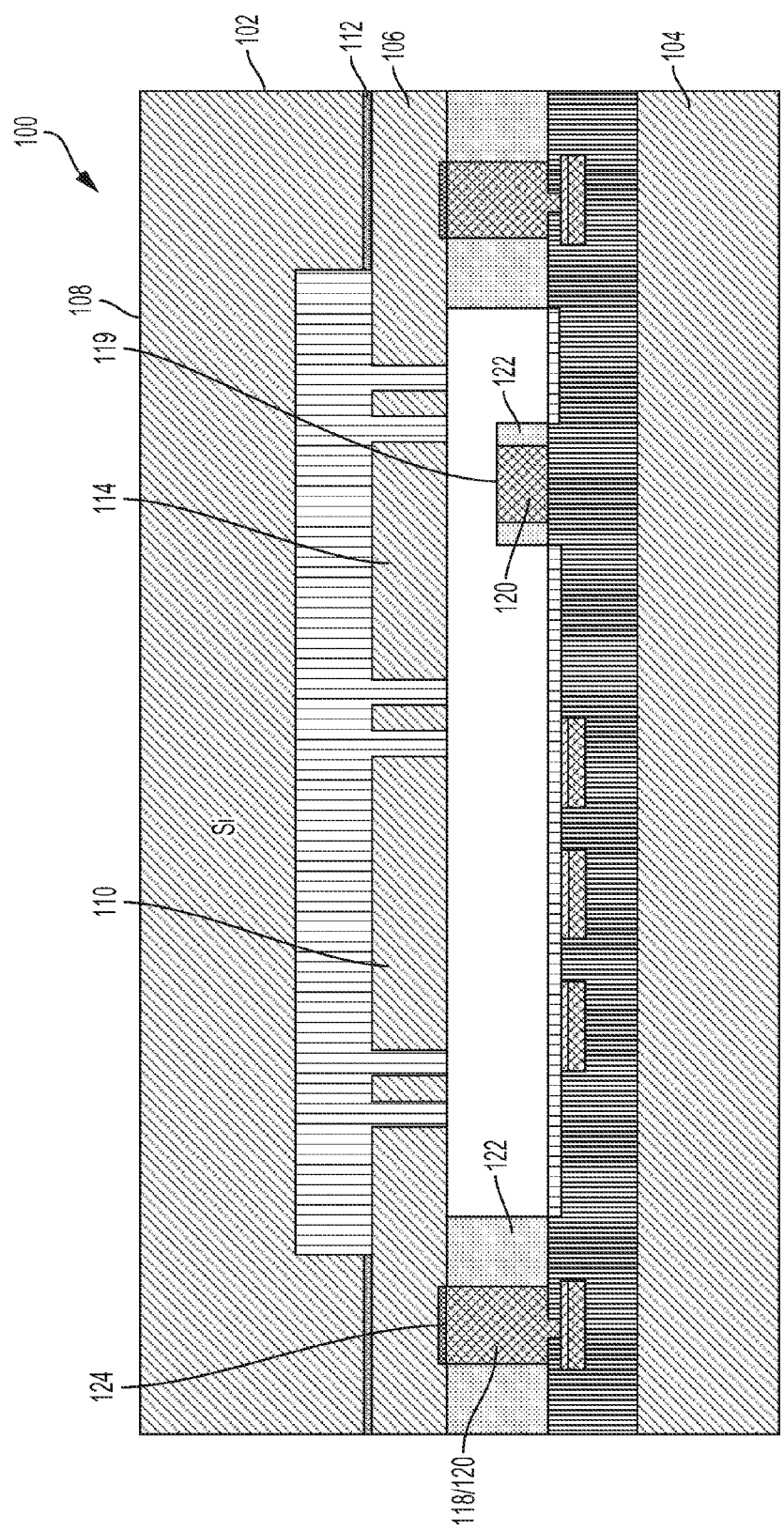
FIG. 1 is a diagram of a CMOS-MEMS structure in accordance with an embodiment.

The present invention relates generally to CMOS-MEMS integrated devices and more particularly to method of fabrication for CMOS-MEMS integrated devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, a method and system in accordance with the present invention is not intended to be limited to the embodiment shown but is to be accorded the widest scope consistent with the principles and features described herein.

In the described embodiments Micro-Electro-Mechanical Systems (MEMS) refers to a class of structures or devices fabricated using semiconductor-like processes and exhibiting mechanical characteristics such as the ability to move or deform. MEMS often, but not always, interact with electrical signals. MEMS devices include but are not limited to gyroscopes, accelerometers, magnetometers, pressure sensors, and radio-frequency components. Silicon wafers containing MEMS structures are referred to as MEMS wafers.

In the described embodiments, MEMS device may refer to a semiconductor device implemented as a micro-electro-mechanical system. MEMS structure may refer to any feature that may be part of a larger MEMS device. An engineered silicon-on-insulator (ESOI) wafer may refer to a SOI wafer with cavities beneath the silicon device layer or substrate. Handle wafer typically refers to a thicker substrate used as a carrier for the thinner silicon device substrate in a silicon-on-insulator wafer. Handle substrate and handle wafer can be interchanged.

In the described embodiments, a cavity may refer to an opening or recession in a substrate wafer and enclosure may refer to a fully enclosed space. Bond chamber may be an enclosure in a piece of bonding equipment where the wafer bonding process takes place. The atmosphere in the bond chamber determines the atmosphere sealed in the bonded wafers.

Additionally, a system and method in accordance with the present invention describes a class of RF MEMS devices, sensors, and actuators including but not limited to switches, resonators and tunable capacitors that are hermetically sealed and bonded to integrated circuits that may use capacitive sensing and electrostatic, magnetic, or piezo-electric actuation.

In order to bond a CMOS substrate with a MEMS substrate to CMOS substrate to form a CMOS-MEMS integrated device a process is utilized which provides for two steps. A first bonding step bonds a top metal layer of the MEMS substrate to a top metal layer of the CMOS substrate and a second bonding step bonds a MEMS handle layer to the MEMS actuator layer. Both of these bonding steps can be performed at low temperature (150-400 degrees C.) at a reduced pressure. Both of the bonding steps also can be utilized to provide a hermetic seal for the device.

Accordingly, this process overcomes some of the issues associated with high temperature bonding processes. Namely a process in accordance with the present invention eliminates the high bonding force requirement associated with the traditional eutectic bond between the CMOS substrate and the MEMS substrate and therefore reduces stresses and minimizes warping of the bonded structure since a high temperature is not required.

In addition the gap height control is improved over conventional bonding processes for CMOS-MEMS integrated devices. Finally using the process in accordance with the present invention a timed etch to form standoffs on the CMOS-MEMS integrated device is no longer required. The processes described below provide for the fabrication of CMOS-MEMS integrated devices using first and second low temperature bonding steps to create a sealed enclosure between the MEMS and CMOS wafers. The first bonding step comprises a metal to metal bond that can provide electrical connection between a MEMS substrate and a CMOS substrate. The second bonding step comprises a fusion bond that coupled a handle layer of the MEMS substrate to an actuator layer of the MEMS substrate and does not provide for any electrical interconnection.

Below is provided an approach available with a method and system in accordance with the present invention, in one or more embodiments, providing for the integration of such devices to create a CMOS-MEMS integrated device. In the described embodiments, the CMOS wafer may be replaced by any suitable capping wafer or substrate.

FIG. 1 is a diagram of a CMOS-MEMS structure in accordance with an embodiment. For the embodiment, it will be appreciated that a CMOS-MEMS integrated device 100 comprises a MEMS substrate 102 and a CMOS substrate 104. The CMOS substrate 104 includes a bump stop 119 that can in an embodiment composed of metal 120 such as Copper or Nickel surrounded by an oxide layer 122. The bump stop 119 can be electrically connected to the underlying metal or can be electrically isolated. The MEMS substrate 102 includes a MEMS actuator layer 106 and a MEMS handle layer 108 with at least one cavity 110 bonded to the MEMS actuator layer 106 through a dielectric layer 112 disposed between the MEM handle layer 108 and the MEMS actuator layer 106. The MEMS actuator layer 106 also includes a moveable portion 114.

A top metal 118 of the MEMS actuator layer 106 and a top metal 120 of the CMOS substrate 104 are used to first bond the CMOS substrate 104 to the MEMS actuator layer 106. The top metal 118 of the MEMS actuator layer 106 includes a contact layer 124, which is composed of, for example, Titanium Nitride (TIN). In an embodiment, the top metals 118 and 120 can be made of materials that bond at temperatures between 150-400 degrees Celsius that include, but are not limited to any of copper (Cu) and nickel (Ni). The standoffs 130 are formed via an etch of the oxide layers 122 on the CMOS substrate 104 and the MEMS actuator layer 106.

The MEMS actuator layer 106 is coupled to the MEMS handle layer 108 and the dielectric layer 112 via a second bond. In an embodiment, the first bond comprises a compression bond for a metal to metal connection that is provided at a temperature in the range of 150-400 degrees C. and the second bond comprises a fusion bond which is also provided at a temperature in the range of 150-400 degrees C.

In an embodiment, first and second bonds are implemented utilizing the Direct Bond Interconnect (DBI) process which has been developed by Ziptronix Inc. To describe the features of the present invention in more detail refer now to following discussion in conjunction with the accompanying Figures.

Figure 2:
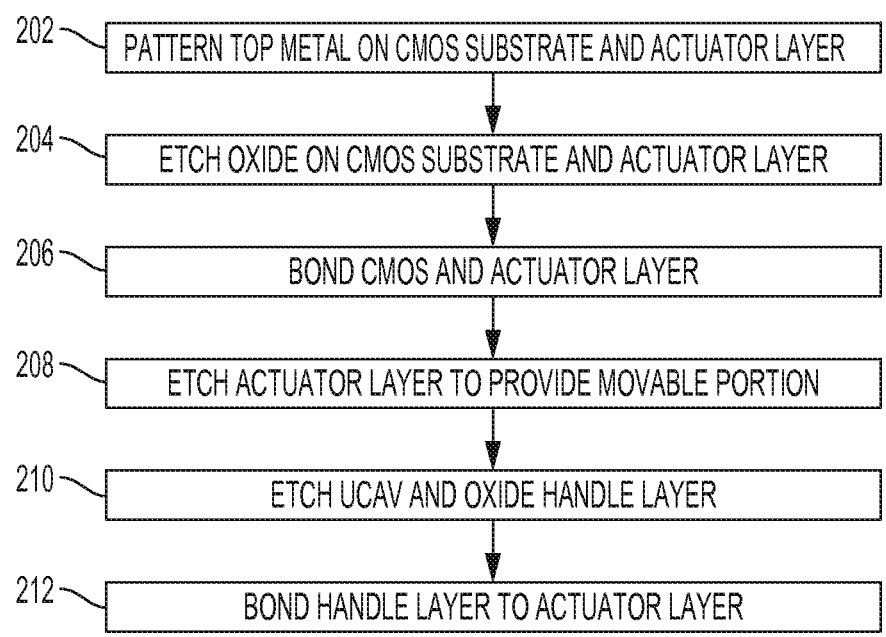
FIG. 2 is a flow chart of the process flow of a fabrication of a CMOS-MEMS structure in accordance with an embodiment.
Figure 3A:
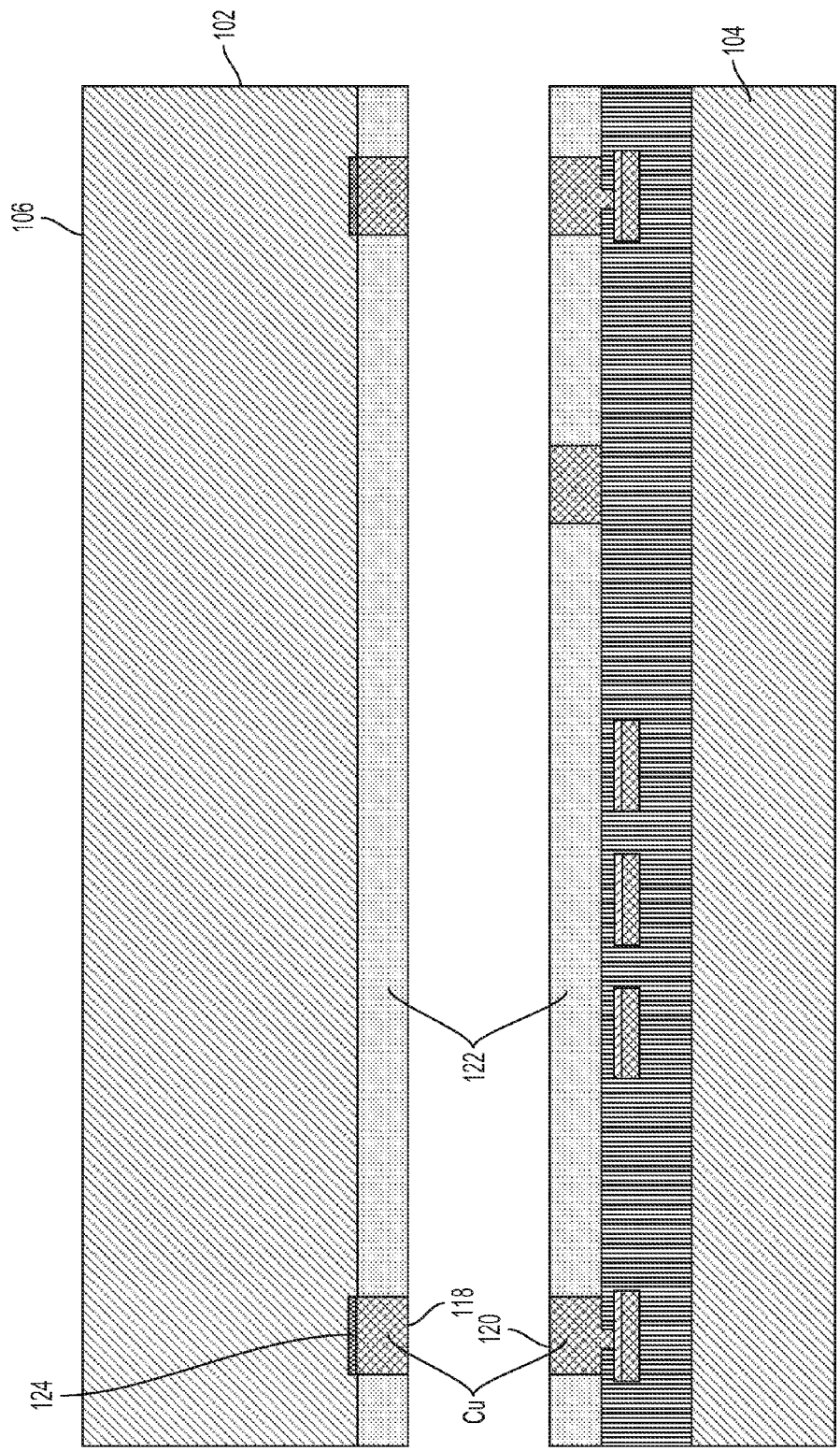
FIGS. 3A-3F are diagrams that illustrate fabrication of a CMOS-MEMS structure in accordance with the process flow of FIG. 2.
Figure 3B:
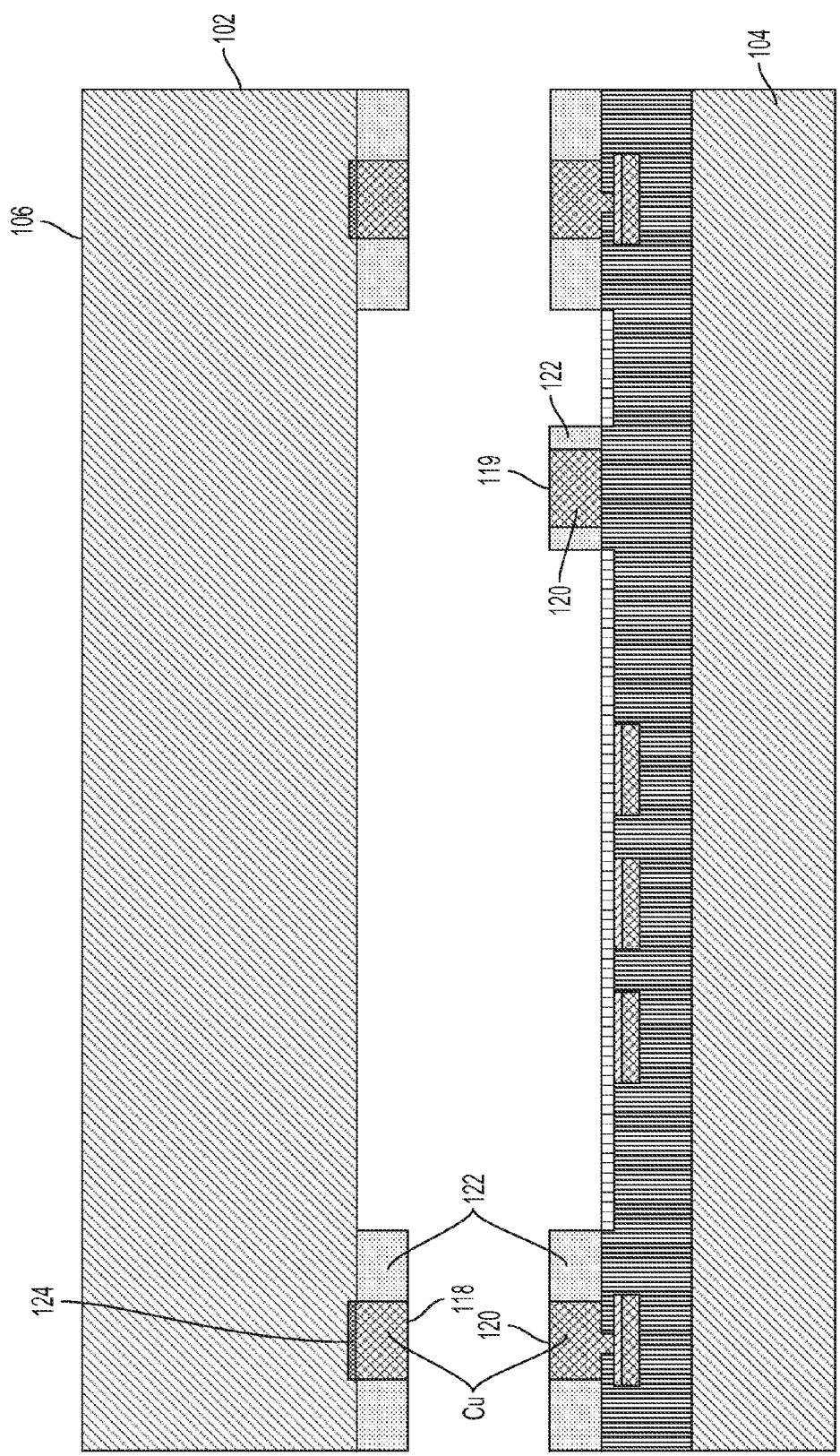

FIG. 2 is a flow chart of the process flow of a fabrication of a CMOS-MEMS structure in accordance with an embodiment. FIGS. 3A-3F are diagrams that illustrate fabrication of a CMOS-MEMS structure in accordance with the process flow of FIG. 2. Referring to FIGS. 2 and 3A-3F together, first, top metals 118 and 120 are patterned on the CMOS substrate 104 and the MEMS actuator layer 106 as shown in FIG. 3A, via step 202. Thereafter an oxide layer is etched on the CMOS substrate 104 and the MEMS actuator layer 106 as shown in FIG. 3B to form the standoffs 130 and the bump stop 119, via step 204.

Figure 3C:
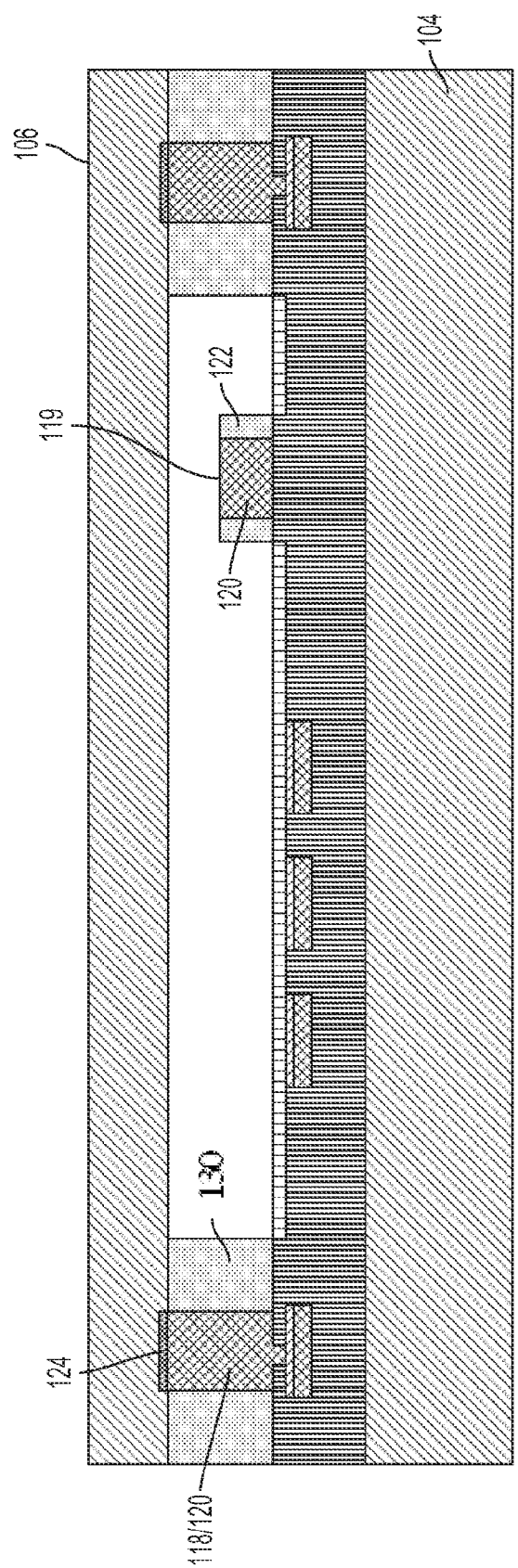

Thereafter the top metals 118 and 120 of the CMOS substrate 104 and the MEMS actuator layer 106 are bonded using a low temperature bond as shown in FIG. 3C, via step 206. As before mentioned, in an embodiment the low temperature bond is in a temperature range of 150-400 degrees C. In an embodiment, MEMS actuator layer 106 is ground down to a desired thickness. The desired thickness in some embodiments is between 10-100 microns. Through the first bond an electrical or conductive connection is made between the CMOS substrate 104 and the MEMS actuator layer 106.

Figure 3D:
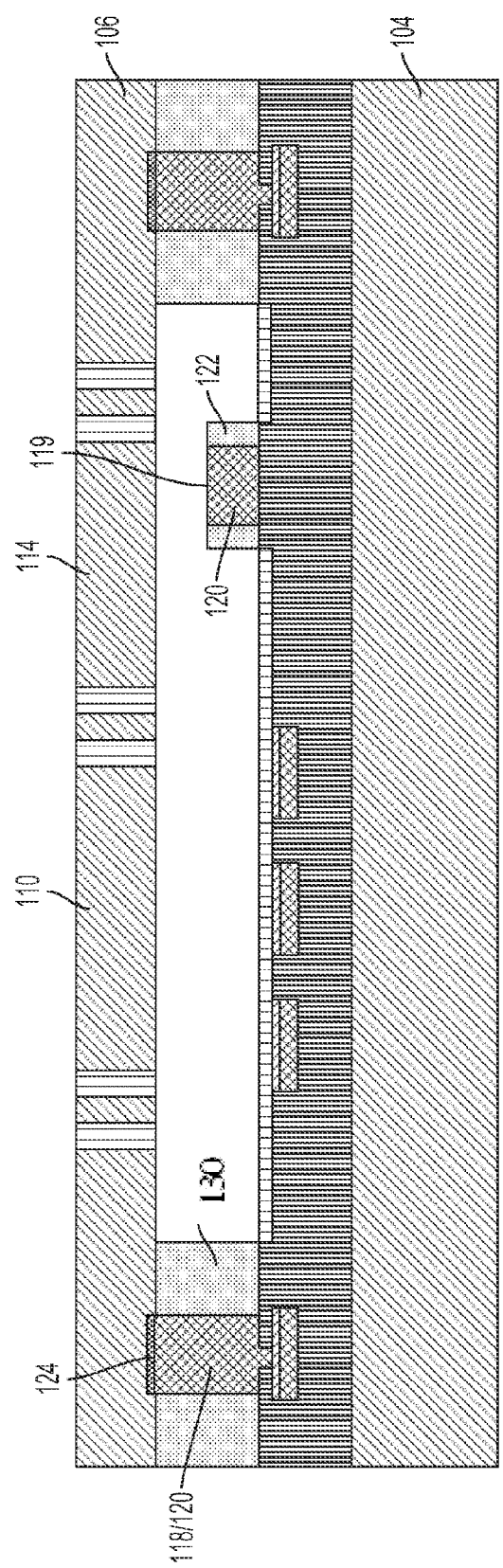
Figure 3E:
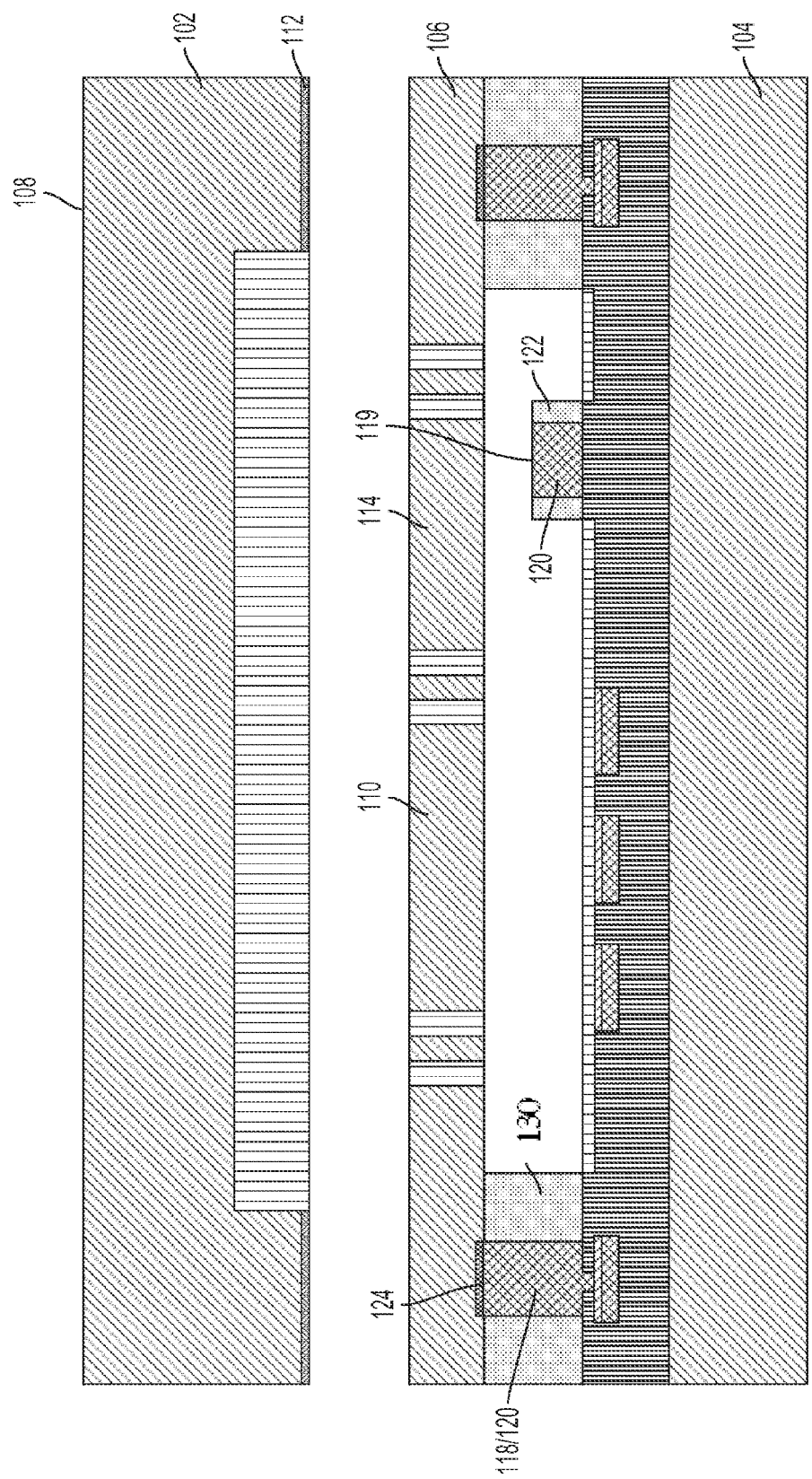
Figure 3F:
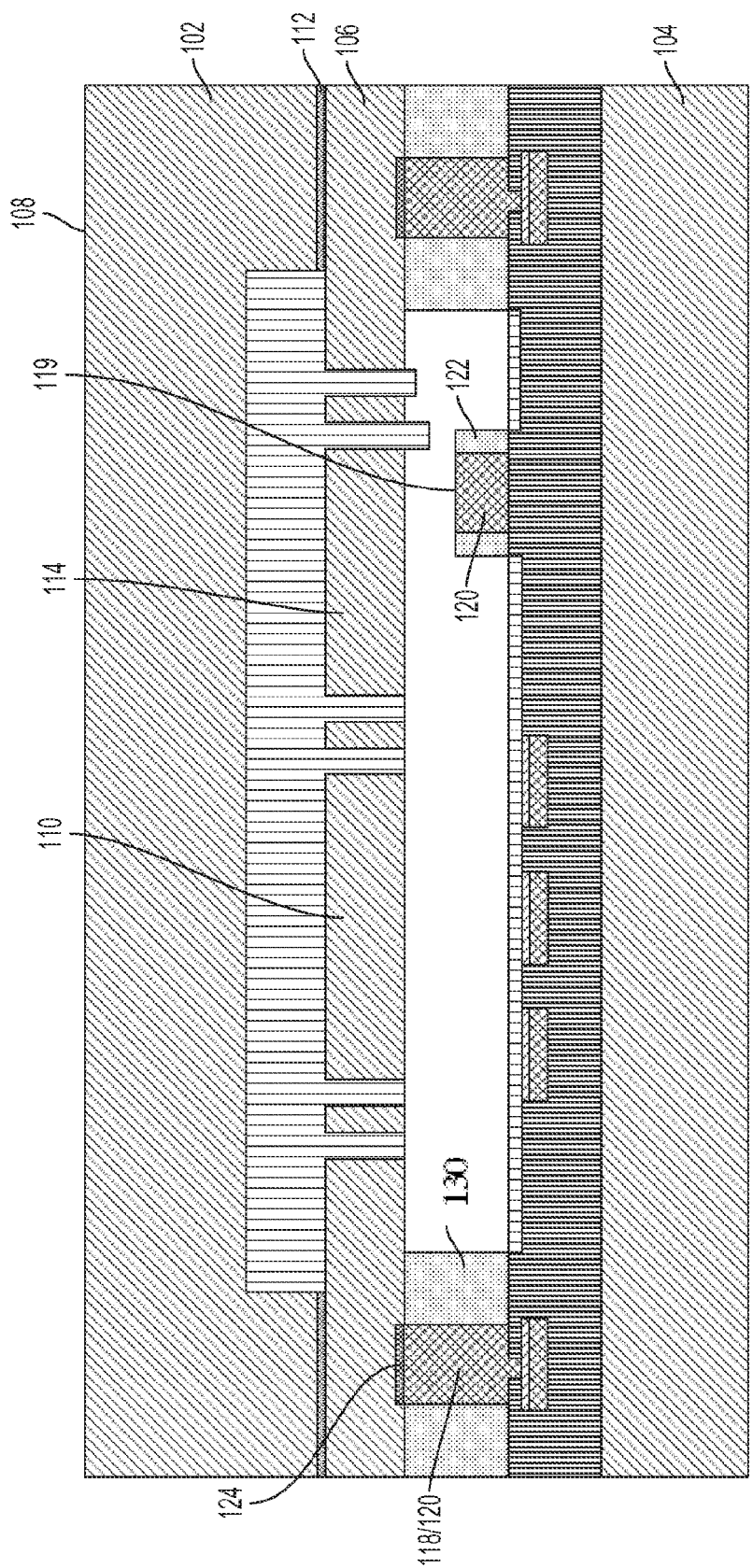

Thereafter, the MEMS actuator layer 106 is etched to provide a movable portion 114 as shown in FIG. 3D, via step 208. Then a cavity 110 is formed and a MEMS handle layer 108 is oxidized as shown in FIG. 3E, via step 210. Thereafter the MEMS handle layer 108 is bonded to the MEMS actuator layer 106 as shown in FIG. 3F, via step 212.

A process in accordance with the present invention provides the following features:

1. Utilizes a low temperature process that reduces stresses on the device while still having a high bond energy.

2. Provides bonded electrical interconnections between MEMS substrate and CMOS substrate.

3. Provides a well controlled gap between the CMOS substrate and the MEMS substrate 4. Does not require a top anchor for the MEMS substrate because the Moveable MEMS structure is only anchored to the CMOS substrate, making it less sensitive to external stresses placed on the MEMS handle substrate.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A method comprising:
    patterning a first top metal layer on a microelectromechanical system (MEMS) actuator layer and a second top metal layer on a complementary metal-oxide semiconductor (CMOS) substrate to generate a patterned first top metal layer and a patterned second top metal layer, wherein the MEMS actuator layer and the CMOS substrate have respective oxide layers on the MEMS actuator layer and the CMOS substrate;
    etching respective portions of the respective oxide layers on the MEMS actuator layer and the CMOS substrate;
    bonding the patterned first top metal layer to the patterned second top metal layer;
    etching the MEMS actuator layer to cause release of a movable structure; and
    bonding the MEMS actuator layer to a MEMS handle substrate.

2. The method of claim 1, wherein the etching the respective portions of the respective oxide layers comprises providing at least one standoff disposed between the CMOS substrate and the MEMS actuator layer, and wherein a first end of the standoff is disposed on the CMOS substrate and a second end of the standoff is disposed on the MEMS actuator layer.

3. The method of claim 2, wherein the standoff comprises the patterned first top metal layer or the patterned second top metal layer.

4. The method of claim 1, further comprising grinding the MEMS actuator layer to a defined thickness after the bonding the patterned first top metal layer to the patterned second top metal layer.

5. The method of claim 4, wherein the defined thickness is between about 10 and about 100 microns.

6. The method of claim 1, further comprising:
providing a cavity in the MEMS handle layer; and
oxidizing the MEMS handle layer prior to the bonding the MEMS actuator layer to a MEMS handle substrate.

7. The method of claim 1, wherein the bonding the patterned first top metal layer to the patterned second top metal layer comprises a first low temperature bond and wherein the bonding the MEMS actuator layer to a MEMS handle substrate comprises a second low temperature bond.

8. The method of claim 7, wherein the first low temperature bond comprises a compression bond and the second low temperature bond comprises a fusion bond.

9. The method of claim 1, wherein a temperature of the bonding the patterned first top metal layer to the patterned second top metal layer and the bonding the MEMS actuator layer to a MEMS handle substrate is between about 150 and about 400 degrees Celsius.

10. The method of claim 1, wherein the patterned first top metal layer and patterned second top metal layer comprise at least one of copper (Cu) or nickel (Ni).

11. The method of claim 1, wherein patterning comprises damascene patterning.

12. The method of claim 1, wherein the patterned first top metal layer and the patterned second top metal layer are utilized to electrically connect the MEMS actuator layer and the CMOS substrate.

13. The method of claim 1, wherein the bonding the patterned first top metal layer to the patterned second top metal layer and the bonding the MEMS actuator layer to a MEMS handle substrate provide a hermetic seal for the device.

14. The method of claim 1, wherein the standoff defines a gap between the movable structure and the CMOS substrate.

15. The method of claim 1, further comprising:
forming a bump stop based on another etching of the respective other portions of the respective oxide layers.

16. The method of claim 1, further comprising:
forming a contact layer on the patterned first top metal layer of the MEMS actuator layer.

17. The method of claim 1, wherein the patterned first top metal layer and the patterned second top metal layer respectively comprises a first copper material and a second copper material.

18. The method of claim 1, wherein the patterned first top metal layer and the patterned second top metal layer respectively comprises a first nickel material and a second material, and wherein the second material comprises at least one of copper or nickel.

19. The method of claim 15, wherein the bump stop is electrically isolated from the patterned second top metal layer.

20. The method of claim 16, wherein the contact layer is comprised of Titanium.

* * * * *